United States Patent
Hoffmann et al.

(10) Patent No.: US 7,490,274 B2
(45) Date of Patent: Feb. 10, 2009

(54) METHOD AND APPARATUS FOR MASKING KNOWN FAILS DURING MEMORY TESTS READOUTS

(75) Inventors: Jochen Hoffmann, Colchester, VT (US); Carsten Ohlhoff, Munich (DE); Peter Beer, Tutzing (DE)

(73) Assignee: Infineon Technologies AG, Munich (DE)

( * ) Notice: Subject to any disclaimer, the term of this patent is extended or adjusted under 35 U.S.C. 154(b) by 115 days.

(21) Appl. No.: 11/397,790

(22) Filed: Apr. 4, 2006

(65) Prior Publication Data
US 2006/0242492 A1 Oct. 26, 2006

Related U.S. Application Data

(62) Division of application No. 10/425,224, filed on Apr. 29, 2003, now Pat. No. 7,137,049.

(51) Int. Cl.
*G11C 29/00* (2006.01)
(52) U.S. Cl. .................. 714/710; 714/719
(58) Field of Classification Search ............. 714/718, 714/719, 723, 710
See application file for complete search history.

(56) References Cited
U.S. PATENT DOCUMENTS

| | | | | |
|---|---|---|---|---|
| 4,369,511 A | * | 1/1983 | Kimura et al. | 714/719 |
| 5,729,551 A | * | 3/1998 | Park et al. | 714/711 |
| 6,735,727 B1 | * | 5/2004 | Lee | 714/711 |
| 6,920,072 B2 | * | 7/2005 | Theel | 365/200 |
| 2001/0044916 A1 | * | 11/2001 | Blodgett | 714/711 |

* cited by examiner

*Primary Examiner*—James C Kerveros
(74) *Attorney, Agent, or Firm*—Patterson & Sheridan, L.L.P.

(57) ABSTRACT

Embodiments of the present invention generally provide methods and apparatus for testing memory devices having normal memory elements and redundant memory elements. During a front-end testing procedure, normal memory elements that are found to be defective are replaced by redundant memory elements. During the front-end test, redundant memory elements that are found to be defective may be marked as defective by blowing associated mask fuses. During a back-end testing procedure, the results of testing a normal memory element may be masked (e.g., forced to a passing result) if the normal memory element has been replaced by a redundant memory element. Similarly, the results of testing a redundant memory element may be masked if the redundant memory element was previously found to be defective, as indicated by an associated mark fuse. By masking the test results for memory elements (normal and redundant) that have been previously found defective, the memory elements may be tested in the same manner during front-end and back-end testing.

4 Claims, 6 Drawing Sheets

METHOD AND APPARATUS FOR MASKING KNOWN FAILS DURING MEMORY TESTS READOUTS

CROSS-REFERENCE TO RELATED APPLICATIONS

This application is a divisional application of U.S. patent application Ser. No. 10/425,224, entitled METHOD AND APPARATUS FOR MASKING KNOWN FAILS DURING MEMORY TESTS READOUTS, filed Apr. 29, 2003, by Hoffmann et al., now U.S. Pat. No. 7,137,049. This related patent application is herein incorporated by reference in its entirety.

BACKGROUND OF THE INVENTION

1. Field of the Invention

The present invention generally relates to memory testing, and more particularly to masking the results of post-replacement testing of memory elements known to be defective.

2. Description of the Related Art

Memory chips are fabricated using state-of-the-art technologies with minimum feature-sizes implemented on the memory chips wherever possible. Memory chips are designed to allow for the storage of a large amount of information on one chip (currently 512 Mbits or more for a DRAM (Dynamic Random Access Memory) chip). One of the major determinants of the cost of producing memory chips is wafer yield, which is defined as the ratio of non-defective chips over the total chips fabricated on a given wafer. In general, the higher the integration density of a memory chip, the higher the probability that one or more memory cells of the memory chip will be defective. Thus, the higher the integration density of the chips fabricated on a given wafer, the lower the wafer yield. Accordingly, it is necessary to correct defects in order to enhance wafer yield, especially with the advent of high-density memory chips.

One effective method of correcting memory cell defects in a memory device is to provide a redundant memory cell array in addition to the normal memory cell array of the memory device. The redundant memory cell array comprises one or more redundant blocks of memory cells used to replace one or more normal blocks of memory cells of the normal memory cell array which contain defective memory cells found during testing. When a normal block of memory cells contains one or more defective memory cells, the entire block is considered defective and needs to be replaced by a non-defective redundant block.

Typically, the redundant memory cell array has one or more programmable redundancy determining units attached thereto, one for each redundant block. During testing of the memory chip, if a normal block of the normal memory cell array is found defective, the redundancy determining unit is programmed to select a non-defective redundant block if the address of the defective normal block is applied to the memory device.

The redundancy determining unit is typically programmed by blowing one or more fusible links, i.e., an address fuse, for each address bit input of the memory device. The address fuses may be conventional fuses, requiring an external device, such as a laser, for blowing. Alternatively, the address fuses may be electrically programmable fuses and the memory device may include an internal circuit for blowing the fuses. Regardless, the address fuses of the programmable redundancy determining unit are selectively blown depending on the address of the defective normal block which the associated redundant block is supposed to replace. For example, the address fuses may be selectively blown externally (e.g., by a laser), or internally, for example, utilizing an on-chip voltage or current source and a plurality of selection-circuits to select unique fuses from existing sets of fuses based on certain input-criteria (e.g., a set of address-bits, enable bits, etc.).

Conventionally, after the replacement is enabled (e.g., post-fuse), if a memory access to the defective normal block is initiated (i.e., a redundancy hit), the programmed redundancy determining unit associated with the replacing redundant block selects the replacing redundant block and stops the selection of the defective normal block.

To properly test for defective memory cells, testing of the interdependency between adjacent cells is of particular importance. A memory cell might be functional in very simple tests, but might fail if adjacent cells behave in a certain way. As an example, a row of memory cells may pass a test when one adjacent row of memory cells contains a first test pattern but may fail the same test when another adjacent row of memory cells contains a second test pattern. Accordingly, the interdependency between adjacent cells has to be tested in order to ensure that the memory device will not fail in user applications.

Conventionally, testing of the interdependency between adjacent cells must be performed prior to replacing defective memory cells with redundant memory cells. This is because prior to any replacement, the normal blocks and the redundant blocks can be accessed in their own address spaces. As a result, testing of interdependency between adjacent cells can be easily carried out by accessing adjacent blocks. After replacement, however, the replacing redundant block is mirrored (or mapped) from the redundant address space into the normal address space at the location of the replaced normal block. As a result, testing of the interdependency between adjacent rows involving a replaced normal row cannot be properly performed.

After front-end testing and replacement of defective fuses, an accelerated aging (burn-in) test is typically performed. After the burn-in tests, the memory devices are typically packaged and a back-end-test is performed to check whether the memory devices still conform to a set of specifications. Because performance of the chip may deteriorate during the burn-in tests, front-end tests are typically run to specifications that are somewhat more stringent than the back-end tests. Because conventional techniques do not allow for testing interdependencies between adjacent memory-cells during back-end testing, these tests are moved into the front-end test. Accordingly, these tests are performed against the more stringent front-end specifications, which results in a higher amount of failing chips and unnecessary yield-losses.

Accordingly, there is a need for an apparatus and method for performing post-replacement (back end) testing of memory devices which overcomes shortcomings existing in the prior art.

SUMMARY OF THE INVENTION

In one embodiment, a method of performing post-replacement testing of a memory device is described. The method comprises in sequence (a) writing a test pattern into a memory block of the memory device, (b) memorizing the test pattern by the memory device independently from the memory block, (c) retrieving, by the memory device, a content of the memory block, (d) comparing, with the memory device, the memorized test pattern and the retrieved content of the memory block to generate a test result for the memory block, and (e) masking the test result with a pass test result by the memory device if the memory block was previously found defective during pre-replacement testing.

In another embodiment, a memory device that facilitates its own post-replacement testing is described. The memory device comprises at least a memory block, wherein the memory device is configured to in sequence (a) write a test pattern into the memory block, (b) memorize the test pattern independently from the memory block, (c) retrieve a content of the memory block, (d) compare the memorized test pattern and the retrieved content of the memory block to generate a test result for the memory block, and (e) mask the test result with a pass test result if the memory block was previously found defective during pre-replacement testing.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are, therefore, not to be considered limiting of its scope, for the invention may admit to other equally effective embodiments.

DETAILED DESCRIPTION OF THE PREFERRED EMBODIMENTS

Embodiments are provided in which a method and an apparatus for preventing, during post-replacement testing, the reporting of defects of memory blocks that were previously found during pre-replacement testing. The previously found defects are masked by causing a test result generating circuit to generate a pass test signal to the tester whenever these defective blocks are tested during post-replacement testing. As a result, these defects are not reported again during post-replacement testing. As used herein, the term "memory element" generally refers to one or more memory cells. Therefore, a memory element may be a single memory cell, or a set of memory cells that share a common wordline (WL) or a column-select-line (CSL). Further, a memory element may be referred to as defective if a single memory-cell is failing. Accordingly, a failure of a single memory cell may result in replacement of an entire memory element (a whole WL/CSL, containing the cell) by blowing a set of address-fuses to select a redundant memory element. To facilitate understanding, embodiments of the present invention may be described with reference to specific circuitry (e.g., test circuitry, masking circuitry, etc.). However, embodiments of the present invention may be generally applied to mask known failures during test readout, regardless of the specific type of test algorithm, masking algorithm, test circuitry, or masking circuitry utilized.

Figure 1:
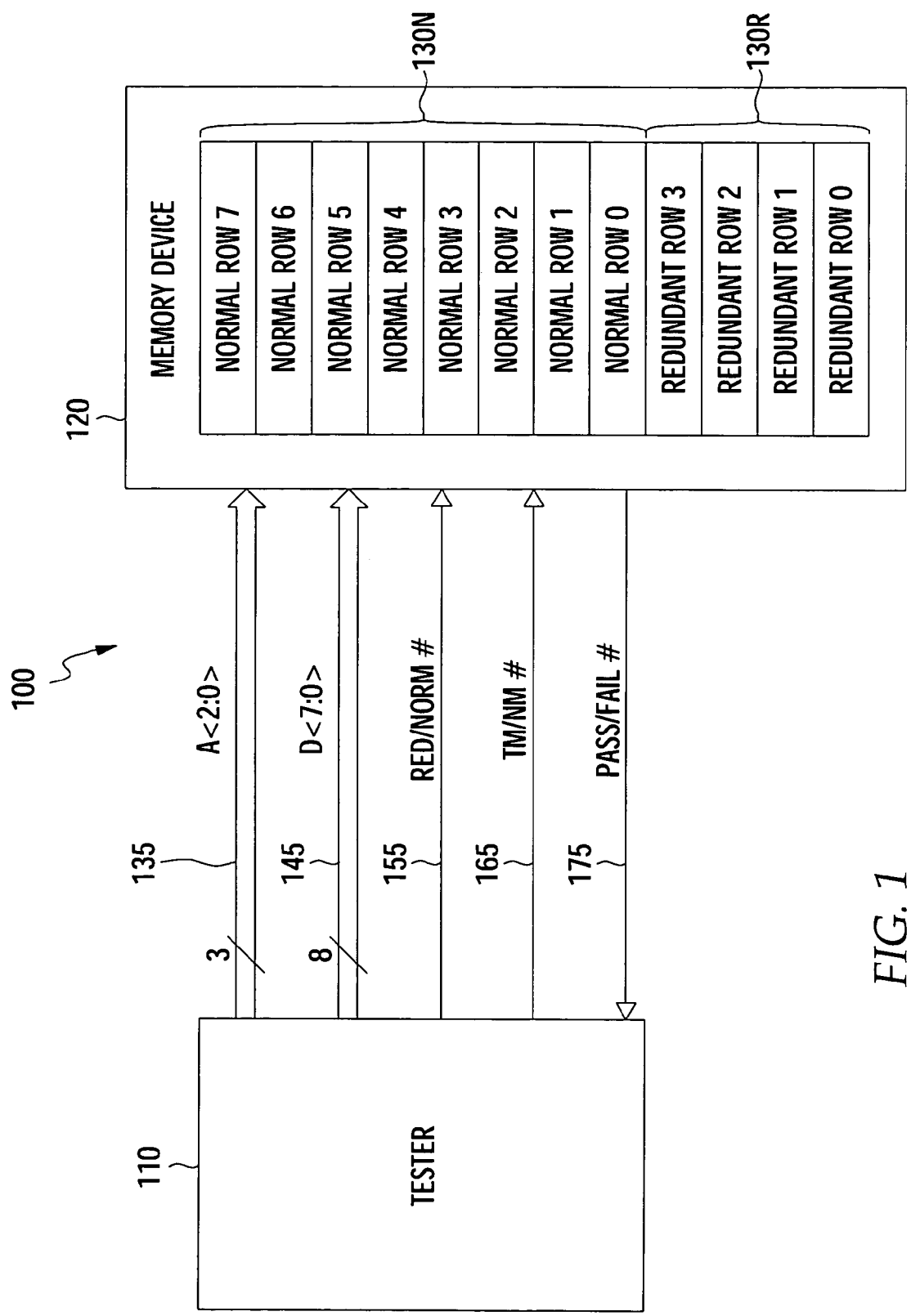
FIG. 1 is a testing system 100 according to one embodiment of the present invention.

FIG. 1 is a testing system 100 according to one embodiment of the present invention. Illustratively, the testing system 100 comprises a tester 110 and a memory device 120. The tester 110 can be any processor or state machine capable of generating addresses, test data, and control signals and receiving test results. The memory device 120 comprises, illustratively, a normal memory cell array 130N of 8 normal rows 0-7 and a redundant memory cell array 130R of 4 redundant rows 0-3. Any one of the redundant rows 0-3, if non-defective, can be used to replace any defective one (if any) of the normal rows 0-7.

In one embodiment, the tester 110 and the memory device 120 are coupled together via an address bus 135, a data bus 145, and connections 155, 165, and 175. For illustration, the address bus 135 has three physical lines representing address bits A<2:0>. The data bus 145 has, illustratively, eight physical lines representing data bits D<7:0>. Connection 155 transmits a redundant/normal signal RED/NORM# ("#" indicates active low) from the tester 110 to the memory device 120. Connection 165 transmits a test mode/normal mode signal TM/NM# from the tester 110 to the memory device 120. Connection 175 transmits a test result signal PASS/FAIL# from the memory device 120 to the tester 110. For other embodiments, pass/fail test results may be transmitted on the data bus 145. For example, the resolution of pass/fail information may be increased by providing a pass/fail result for each bit of an array (e.g., a 0 on a data pin may signify a pass, while a 1 may signify a fail), which may be useful where bits of an array may be replaced by different redundant elements.

RED/NORM# indicates to the memory device 120 which array (normal array 130N or redundant array 130R) the tester 110 is accessing. If RED/NORM# is low, the tester 110 is accessing a normal row of the normal array 130N. If RED/NORM# is high, the tester 110 is accessing a redundant row of the redundant array 130R. In other words, RED/NORM# defines two separate address spaces: a normal address space (RED/NORM# being low) in which all normal rows are located and a redundant address space (RED/NORM# being high) in which all redundant rows are located.

When RED/NORM# is low (i.e., the tester 110 is accessing a normal row), TM/NM# indicates to the memory device 120 whether replacements, if any, are disabled. If TM/NM# is low (indicating normal mode), all replacements if any are enabled. In other words, if a normal row is being accessed by a user program, the normal row itself is accessed if the normal row is not replaced. But if the normal row has been replaced, the replacing redundant row is accessed. Therefore, when the memory device 120 is used in user applications, it must operate in normal mode. Before shipping of the memory chip 120, RED/NORM# and TM/NM# are hardwired to low so that user applications can access only non-defective normal rows and replacing redundant rows (if any).

If TM/NM# is high (indicating test mode) while RED/NORM# is low, all replacements are disabled. As a result, if the tester 110 is accessing a normal row, the normal row itself is accessed whether the normal row was previously replaced by a redundant row or not. Therefore, whether before or after replacements, the tester 110 can access any normal row (replaced or not) by pulling RED/NORM# low (i.e., accessing the normal array 130N) and TM/NM# high (i.e., in test mode with all replacements, if any, being disabled). Also, whether before or after replacements, the tester 110 can access any redundant row (defective or not) by pulling RED/NORM# high (i.e., accessing the redundant array 130R).

Any suitable algorithm may be implemented by the tester 110 and memory device 120 to test the memory cell arrays.

For example, one suitable test algorithm (and corresponding test circuit) is described in commonly owned U.S. Pat. No. 6,357,027, entitled "On Chip Data Comparator With Variable Data And Compare Result Compression," herein incorporated by reference. As described in the referenced patent, in some embodiments, the tester 110 can test a row (normal or redundant) in the memory device 120 by writing a test pattern into the row. In response, the memory device 120 puts the test pattern into the row and also memorizes the test pattern independently from the row being written to. Later, when the tester 110 reads out a test result corresponding to the row, the memory device 120 retrieves the content of the row and compares it with the memorized test pattern. If they match (called a match), the memory device 120 pulls PASS/FAIL# high on connection 175 indicating to the tester 110 that the row retains the correct data (i.e., the row passes the test). If they do not match (a mismatch), the memory device 120 pulls PASS/FAIL# low on connection 175 indicating to the tester 110 that the row retains the wrong data (i.e., the row fails the test).

In one embodiment, whenever the tester 110 tests a replaced normal row during post-replacement testing, the tester 110 may access the replaced normal row by pulling RED/NORM# low and TM/NM# high. In response, the memory device 120 masks the result of the testing of the replaced normal row by pulling PASS/FAIL# high regardless of whether the content of the replaced normal row matches the corresponding memorized test pattern. As a result, a fail test result for the replaced normal row is not reported. Without this masking, because the replaced normal row is defective, the content of the replaced normal row will not match the corresponding memorized test pattern, and the memory device 120 would pull PASS/FAIL# low indicating to the tester 110 that the replaced normal row has failed the test. With masking, however, if a fail test result (PASS/FAIL# is low) is encountered during post-replacement testing, the normal row being tested must be a new defect not found during pre-replacement testing. As a result, the memory device 120 may be considered as failing the test if at least a new defect is reported to the tester 110.

For example, assume during pre-replacement testing, normal row 2 is found defective and redundant row 0 is non-defective. Assume further that a repair solution is calculated and, as a result, redundant row 0 is chosen to replace normal row 2. Later, during post-replacement testing, with all replacements being disabled, when the tester 110 tests defective normal row 2, the memory device 120 masks the test result (by pulling PASS/FAIL# high regardless of whether the retrieved content of defective normal row 2 matches the corresponding memorized test pattern) so that the defect of normal row 2, which has been corrected by replacement, will not be reported to the tester 110.

In one embodiment of the present invention, the memory device 120 can be configured to mark defective redundant rows found during pre-replacement testing. Later, during post-replacement testing, when the tester 110 tests one of the marked defective redundant rows, the memory device 120 masks the test result (by pulling PASS/FAIL# high regardless of whether the content of the defective redundant row matches the corresponding memorized test pattern) so that the defect of the redundant row will not be reported to the tester 110. As a result, if a fail test result (PASS/FAIL# is low) is encountered during post-replacement testing, the redundant row being tested must be a new defect not found during pre-replacement testing. As a result, the memory device 120 may be considered as failing if one or more new defects of redundant rows are reported to the tester 110. This is because among the newly found defective row(s), there may be one or more replacing redundant row which will be accessed by user applications. It may be safer and cheaper to discard the memory device 120 based on these newly found defective row(s) as opposed to performing further testing of the memory device 120 to ensure that these newly found defective row(s) are not replacing redundant rows.

In the example above, assume further that during pre-replacement testing, redundant row 1 is found defective. The memory device 120 can be configured to mark redundant row 1 as defective. Later, during post-replacement testing, when the tester 110 tests redundant row 1, the memory device 120 masks the test result for redundant row 1 (by pulling PASS/FAIL# high regardless of whether the content of defective redundant row 1 matches the corresponding memorized test pattern) so that the defect of redundant row 1 will not be reported to the tester 110.

Figure 2:
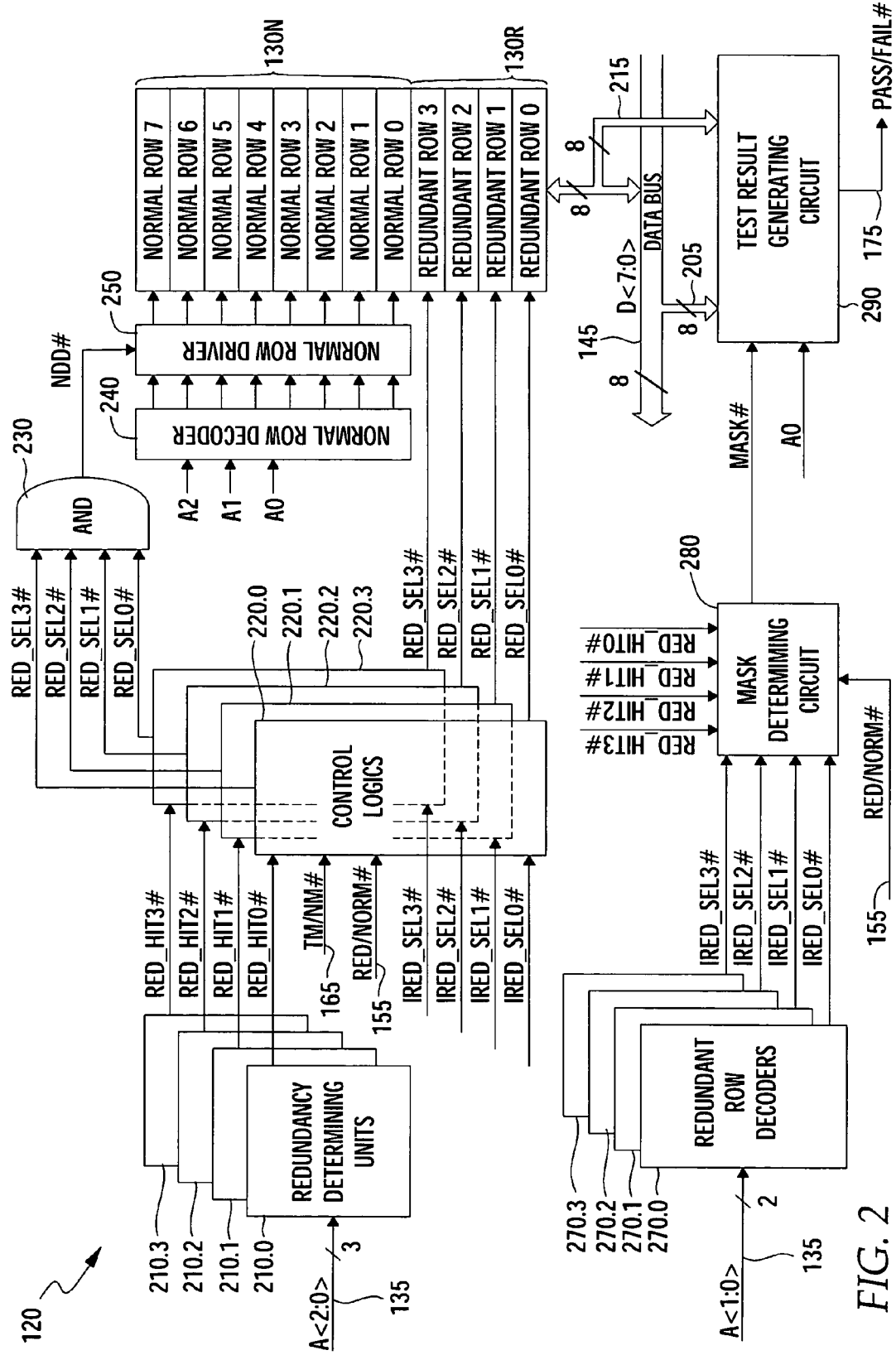
FIG. 2 is one embodiment of the memory device 120 of FIG. 1.

FIG. 2 is one embodiment of the memory device 120 of FIG. 1. Illustratively, the memory device 120 comprises four redundancy determining units 210.0, 210.1, 210.2, and 210.3, four control logic circuits 220.0, 220.1, 220.2, and 220.3, an AND gate 230, a normal row decoder 240, a normal row driver 250, the normal memory cell array 130N of 8 normal rows 0-7, the redundant memory cell array 130R of 4 redundant rows 0-3, four redundant row decoders 270.0, 270.1, 270.2, and 270.3, a masking determining circuit 280, and a test result generating circuit 290. The redundancy determining units 210.0, 210.1, 210.2, and 210.3, the control logic circuits 220.0, 220.1, 220.2, and 220.3, and the redundant row decoders 270.0, 270.1, 270.2, and 270.3 are associated with the redundant rows 0, 1, 2, and 3, respectively.

In one embodiment of the present invention, the normal row decoder 240 receives an address A<2:0> from address bus 135 (FIG. 1) and selects one of normal rows 0-7. The normal row driver 250 drives the normal row selected by the normal row decoder 240 if a normal-row-driver-disable signal NDD# (generated by the AND gate 230) is deasserted (high).

In one embodiment, the redundancy determining unit 210.0 is associated with redundant row 0 and is coupled to the address bus 135, the control logic circuit 220.0, and the mask determining circuit 280. The redundancy determining unit 210.0 receives an address A<2:0> from the address bus 135 and generates a redundancy hit signal REDHIT0# to the associated control logic circuit 220.0 and the mask determining circuit 280.

The redundancy determining unit 210.0 can be programmed based on the address of a defective normal row so that the defective normal row is replaced by associated redundant row 0. If so programmed, whenever the address of the defective normal row is applied to the redundancy determining unit 210.0, the redundancy determining unit 210.0 asserts REDHIT0# to the associated control logic circuit 220.0 and the mask determining circuit 280.

If the memory device 120 is operated in the normal mode and a normal row is being accessed (i.e., TM/NM# and RED/NORM# are both low), asserted REDHIT0# means the normal row has been replaced by redundant row 0. Asserted REDHIT0# causes the control logic circuit 220.0 to assert a redundant row select signal REDSEL0# selecting redundant row 0. Asserted REDSEL0# also causes the AND gate 230 to assert NDD# disabling the normal row driver 250. In other words, the selection of the defective normal row by the normal row decoder 240 is stopped by NDD# being asserted. In short, if the normal row array 130N is accessed in normal mode, the defective normal row is, in effect, replaced by redundant row 0.

In one embodiment, if redundant row 0 is found non-defective during pre-replacement testing but is not chosen to replace any normal row, the associated redundancy determining unit 210.0 is not programmed. If so, the redundancy determining unit 210.0 does not assert REDHIT0# regardless of what address A<2:0> appears on the address bus 135.

In the example above, normal row 2 is found defective during pre-replacement testing and redundant row 0 is chosen to replace normal row 2. As a result, the redundancy determining unit 210.0 is programmed based on the address of normal row 2 (A<2:0>=010b) to carry out the replacement. After the replacement, whenever the normal row array 130N is accessed in normal mode, defective normal row 2 is, in effect, replaced by redundant row 0. More specifically, after the replacement, whenever the address of defective normal row 2 (A<2:0>=010b) is applied to the memory device 120 on address bus 135, the redundancy determining unit 210.0 asserts redundancy hit signal REDHIT0# to the associated control logic circuit 220.0. Assume further that the memory device 120 is operated in the normal mode and a normal row is being accessed (i.e., TM/NM# and RED/NORM# are both low), asserted REDHIT0# causes the control logic circuit 220.0 to assert redundant row select signal REDSEL0# selecting redundant row 0. Asserted REDSEL0# also causes the AND gate 230 to assert NDD# disabling the normal row driver 250. In other words, the selection of normal row 2 by the normal row decoder 240 in response to address A<2:0>=010b is stopped by asserted NDD#. In short, if the normal row array 130N is accessed in normal mode by a user program, defective normal row 2 is, in effect, replaced by redundant row 0.

The redundancy determining units 210.1, 210.2, and 210.3 have structures, functions, and connections similar to those of the redundancy determining unit 210.0. More specifically, each of the redundancy determining units 210.1, 210.2, and 210.3 can be programmed with the address of a defective normal row so that the associated redundant row replaces the defective normal row when the memory device 120 is operated in the normal mode and a normal row is being accessed (i.e., TM/NM# and RED/NORM# are both low).

In one embodiment, the redundant row decoder 270.0 is associated with redundant row 0 and is coupled to address bus 135, control logic circuit 220.0, and the mask determining circuit 280. The redundant row decoder 270.0 decodes the two least significant address bits A<1:0> from the address bus 135 (FIG. 1) to select redundant row 0 if the tester 110 is accessing the redundant row 0 (RED/NORM# is high). More specifically, whenever A<2:0>=X00b (X=don't care), the redundant row decoder 270.0 asserts an initial redundant select signal IREDSEL0# to the associated control logic circuit 220.0 and the mask determining circuit 280.

Other redundant row decoders 270.1, 270.2, and 270.3 have structures, functions, and connections similar to those of the redundant row decoder 270.0. More specifically, the redundant row decoders 270.1, 270.2, and 270.3 are associated with redundant row 1, 2, and 3, respectively. Each of the redundant row decoders 270.1, 270.2, and 270.3 decodes the two least significant address bits A<1:0> from the address bus 135 (FIG. 1) to select the associated redundant row if the tester 110 is accessing the redundant rows (RED/NORM# is high). Redundant rows 1, 2, and 3 are located at address A<2:0>=X01b, X10b, and X11b, respectively. As a result, the tester 110 can test any redundant row, even after replacements, by placing the address of the redundant row on the address bus 135 and pulling RED/NORM# high.

In one embodiment, the control logic circuit 220.0 is associated with redundant row 0 and is coupled to the redundancy determining unit 210.0, the redundant row decoder 270.0, the AND gate 230, redundant row 0, and the tester 110. The control logic circuit 220.0 receives signals REDHIT0# from redundancy determining unit 210.0, IREDSEL0# from redundant row decoder 270.0, RED/NORM# and TM/NM# from the tester 110. The control logic circuit 220.0 generates signals REDSEL0# to redundant row 0 and the AND gate 230.

In one embodiment, if RED/NORM# is high (i.e., the tester 110 is accessing a redundant row), the state of signal REDSEL0# depends on IREDSEL0#. If IREDSEL0# is low (i.e., A<2:0>=X00b), the control logic circuit 220.0 asserts REDSEL0#. Asserted REDSEL0# selects redundant row 0 and causes AND gate 230 to assert NDD# disabling the normal row driver 250. As a result, only redundant row 0 is selected and its content is sent out to the test result generating circuit 290 if the tester 110 is performing a test result read. If the tester 110 is performing a write, the write data on the data bus 145 is written into redundant row 0.

If RED/NORM# is low and TM/NM# is low (i.e., a normal row is being accessed and the memory device 120 is in normal operation mode), the state of signal REDSEL0# depends on REDHIT0#. If REDHIT0# is low (a redundancy hit) indicating that a defective normal row replaced by redundant row 0 is being accessed, the control logic circuit 220.0 asserts REDSEL0#. Asserted REDSEL0# selects redundant row 0 and causes AND gate 230 to assert NDD# disabling the normal row driver 250. In effect, redundant row 0 instead of the replaced normal row is accessed. As a result, if the memory device 120 passes all tests and is ready for packaging, RED/NORM# and TM/NM# are hardwired to low so that user applications can access only non-defective normal rows and the replacing redundant rows, if any (i.e., all replacements being enabled).

In the example above, the redundancy determining unit 210.0 is programmed with the address of defective normal row 2 so that normal row 2 is replaced by redundant row 0 when the normal row array 130N is accessed in normal mode. As a result, if address A<2:0>=010b is placed on the address bus 135, the redundancy determining unit 210.0 asserts REDHIT0# (low). If RED/NORM# is low and TM/NM# is low, asserted REDHIT0# causes the control logic circuit 220.0 to assert REDSEL0#. Asserted REDSEL0# selects redundant row 0 and causes AND gate 230 to assert NDD# disabling the normal row driver 250. In effect, redundant row 0 instead of the replaced normal row 2 is accessed.

If RED/NORM# is low and TM/NM# is high (i.e., the tester 110 is accessing a normal row and the memory device 120 is in test mode), the control logic circuit 220.0 deasserted (pulls high) REDSEL0#. As a result, the control logic circuit 220.0 does not select redundant row 0 and does not cause the AND gate 230 to disable the normal row driver 250.

Other control logic circuits 220.1, 220.2, and 220.3 have structures, functions, and connections similar to those of the control logic circuit 220.0. As a result, if RED/NORM# is low and TM/NM# is high (i.e., the tester 110 is accessing a normal row and the memory device 120 is in test mode), the control logic circuits 220.0, 220.1, 220.2, and 220.3 deassert REDSEL0#, REDSEL1#, REDSEL2#, and REDSEL3#, respectively. Therefore, no redundant row is selected. Also, deasserted REDSEL0#, REDSEL1#, REDSEL2#, and REDSEL3# cause the AND gate to deassert NDD# enabling the normal row driver 250. As a result, only the normal row whose address in on the address bus 135 is accessed by the tester 110. In effect, all replacements, if any, are disabled (or reversed). Therefore, the tester 110 can test any normal row, including any replaced normal row, for interdependency with its adjacent rows by pulling RED/NORM# low and TM/NM# high and placing the address of the normal row on the address bus 135. In the example above, if RED/NORM# is low and TM/NM# is high, and the tester 110 is applying address A<2:0>=010b on the address bus 135 to access replaced normal row 2, normal row 2 itself, not replacing redundant row 0, is accessed.

In one embodiment, the mask determining circuit 280 is coupled to the redundancy determining units 210.0, 210.1, 210.2, and 210.3, the redundant row decoders 270.0, 270.1, 270.2, and 270.3, the test result generating circuit 290, and the connection 155. The mask determining circuit 280 receives signals IREDSELi# (i=0-3) from the redundant row decoders 270.0, 270.1, 270.2, and 270.3, respectively. The mask determining circuit 280 also receives signals REDHITi# (i=0-3) from redundancy determining units 210.0, 210.1, 210.2, and 210.3, respectively. The mask determining circuit 280 also receives signal RED/NORM# from the tester 110 via connection 155. The mask determining circuit 280 generates a masking signal MASK# to the test result generating circuit 290. MASK#, if asserted, causes the test result generating circuit 290 to pull PASS/FAIL# high on the connection 175. While not shown, for some embodiments, the masking determining circuit 280 may also include an input for the TM/NM#, allowing the MASK# signal to be de-asserted during normal operation (when TM/NM# is low).

During pre-replacement testing, if one or more redundant row is found defective, for each of the defective redundant rows, the mask determining circuit 280 can be programmed so as to assert MASK# whenever the tester 110 is accessing the defective redundant row during post-replacement testing (i.e., whenever RED/NORM# is high and IREDSELi# associated with the defective redundant row is low).

In the example above, during pre-replacement testing, redundant row 1 is found defective. As a result, the mask determining circuit 280 can be programmed so as to assert MASK# whenever the tester 110 is accessing defective redundant row 1 during post-replacement testing (i.e., whenever RED/NORM# is high and IREDSEL1# is low).

In one embodiment, if the tester 110 is accessing a normal row (RED/NORM# is low and TM/NM# is high) during post-replacement testing, the mask determining circuit 280 asserts MASK# if the accessed normal row was previously found defective and replaced by a redundant row (i.e., REDHITi# associated with the replacing redundant row is low). In the example above, during pre-replacement testing, normal row 2 is found defective and replaced by redundant row 0. As a result, during post-replacement testing, whenever the tester 110 is accessing defective normal row 2 (i.e., RED/NORM# is low, TM/NM# is high, and REDHIT0# is low), the mask determining circuit 280 asserts MASK# causing the test result generating circuit 290 to pull PASS/FAIL# high on the connection 175. As a result, the defect of normal row 2 which has been corrected by replacement is not reported to the tester 110 during post-replacement testing.

In one embodiment, the test result generating circuit 290 is coupled to the mask determining circuit 280, the address bus 135, the data bus 145, the memory array 130N,130R, and the connection 175. The test result generating circuit 290 receives masking signal MASK# from the mask determining circuit 280 and address bit A0 from the address bus 135. The test result generating circuit 290 also receives data from the data bus 145 and from the memory array 130N,130R via connections 205 and 215, respectively. The test result generating circuit 290 generates signal PASS/FAIL# to the tester 110 via connection 175.

In one embodiment, the tester 110 tests a row (normal or redundant) by writing a test pattern into the row via the data bus 145. More specifically, the tester 110 places the address of the row on the address bus 135 and the test pattern on the data bus 145. Then, the test pattern is placed into the row from the data bus 145. The test pattern is also sent to and stored (memorized) in the test result generating circuit 290 via connection 205. Later, the tester 110 reads the test result corresponding to the row by placing the address of the row on the address bus 135. In response, the memory array 130N,130N outputs the content of the row to the test result generating circuit 290 via connection 215. The test result generating circuit 290 compares the content of the row received from the memory array 130N,130N and the stored (memorized) test pattern.

If MASK# is deasserted (meaning the row being accessed is not found defective during pre-replacement testing) and the two values match, the test result generating circuit 290 pulls PASS/FAIL# high on the connection 175 indicating that the row should be considered passing the test. If MASK# is deasserted and the two values do not match, the test result generating circuit 290 pulls PASS/FAIL# low on the connection 175 indicating that the row fails to retain data written to it. This also indicates the row is a new defect not found during pre-replacement testing.

If MASK# is asserted (meaning the row being accessed is found defective during pre-replacement testing), the test result generating circuit 290 pulls PASS/FAIL# high on the connection 175 indicating that the row should be considered satisfactory regardless of the result of the comparison is a match or a mismatch. This is because asserted MASK# means that the tester 110 is reading the test result for either a defective normal row which has been replaced by a redundant row or a defective redundant row identified during pre-replacement testing. In both of these cases, a mismatch (which will certainly occur because the tested row is previously found defective) should not be reported to the tester 110 as a new defect which may result in the memory device 120 being erroneously considered defective as a whole. A mismatch resulted from a replaced normal row should not be reported to the tester 110 as a new defect because the defect has been corrected via replacement. A mismatch resulted from a defective redundant row identified during pre-replacement testing should not be reported to the tester 110 as a new defect because the defective redundant row will not be accessed by user programs.

In the example above, during post-replacement testing, if the tester 110 tests defective normal row 2 by writing a test pattern into normal row 2 and later reading test results for normal row 2 on connection 175, the mask determining circuit 280 asserts MASK# causing the test result generating circuit 290 to pull PASS/FAIL# high on connection 175. As a result, the resulting mismatch is not reported to the tester 110 as a new defect. Similarly, during post-replacement testing, if the tester 110 tests defective redundant row 1 by writing a test pattern into redundant row 1 and later reading test results for redundant row 1, the mask determining circuit 280 asserts MASK# causing the test result generating circuit 290 to pull PASS/FAIL# high on connection 175. As a result, the resulting mismatch is not reported to the tester 110 as a new defect.

Figure 3:
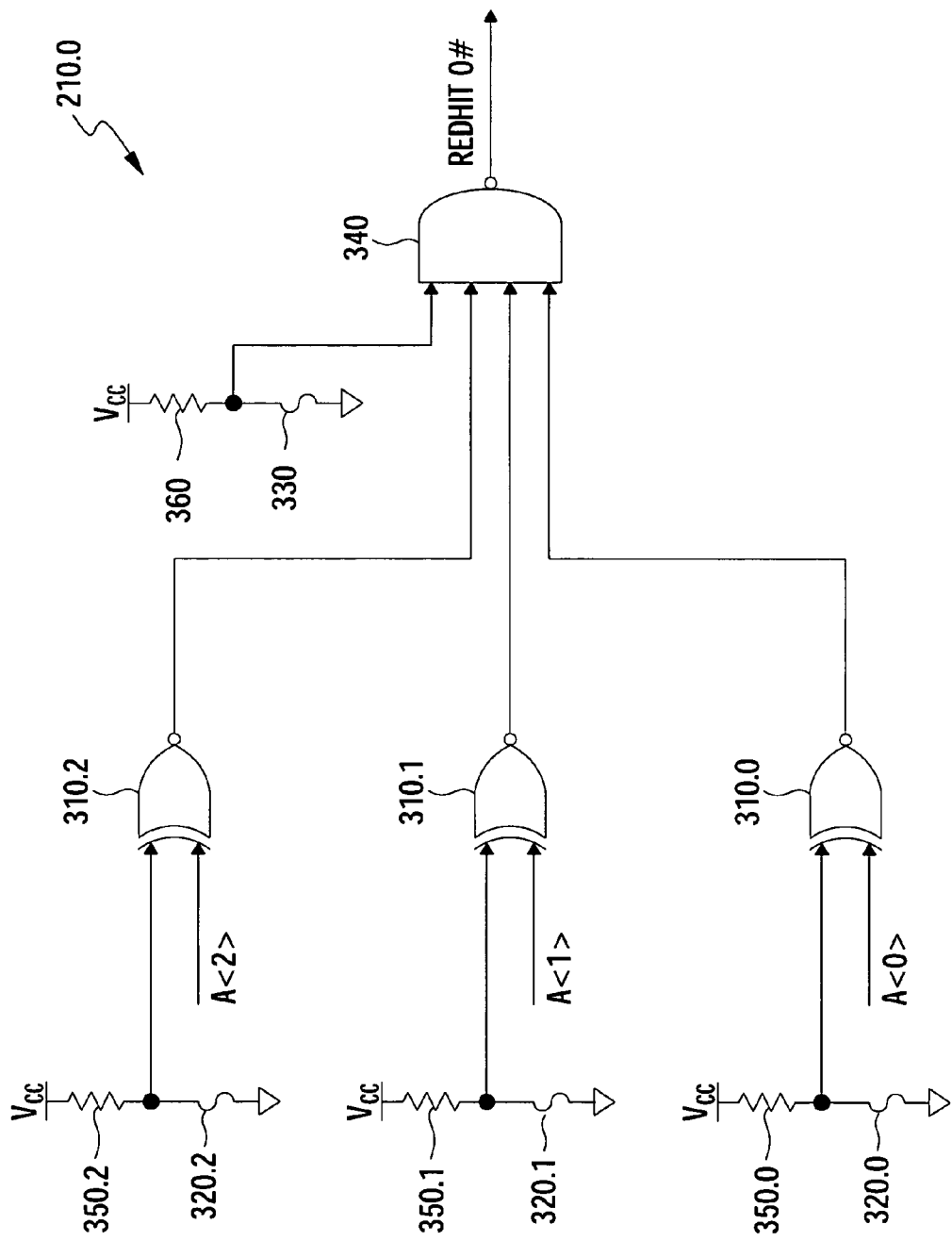
FIG. 3 is one embodiment of the redundancy determining unit 210.0 of FIG. 2.

FIG. 3 is one embodiment of the redundancy determining unit 210.0 of FIG. 2. Illustratively, the redundancy determining unit 210.0 comprises exclusive-NOR gates 310.2, 310.1, and 310.0, address fuses 320.2, 320.1, and 320.0, resistors 350.0, 350.1, and 350.2, a master fuse 330, and a NAND gate 340. The address fuses 320.2, 320.1, and 320.0 are coupled to ground and to Vcc via the resistors 350.0, 350.1, and 350.2, respectively. The NAND gate 340 has one input coupled to ground via the master fuse 330 and to Vcc via a resistor 360.

The exclusive-NOR gate 310.0 includes a first input coupled to ground via the address fuse 320.0 and to Vcc via the resistor 350.0. A second input of the exclusive-NOR gate 310.0 is coupled to associated address bit A<0> of the address bus 135 (FIG. 1). The exclusive-NOR gate 310.0 has an output connected to an input of the NAND gate 340. The other exclusive-NOR gates 320.2 and 320.1 have connections similar to those of the exclusive-NOR gate 310.0. Each of the exclusive-NOR gates 310.2, 310.1, and 310.0 outputs a logic high only if the two inputs of the gate are pulled to the same logic level (either high or low).

To program the redundancy determining unit 210.0 based on an address A<2:0>, the address fuses 320.2, 320.1, and 320.0 are selectively blown according to the address. Then, the master fuse 360 is blown to allow the programming to take effect (i.e., to enable the redundancy-determining unit 210.0).

In the example above, normal row 2 is found defective during pre-replacement testing. After pre-replacement testing is finished, a repair solution is calculated according to which non-defective redundant row 0 is chosen to replace defective normal row 2. To carry out the replacement, the redundancy determining unit 210.0, which is associated with redundant row 0, is programmed based on the address of normal row 2 (A<2:0>=010b). More specifically, the address fuse 320.1 is blown and the address fuses 320.0 and 320.2 are left intact. As a result, the first inputs of the exclusive-NOR gates 310.2, 310.1, and 310.0 are pulled to logic low, high, and low, respectively.

However, if the master fuse 330 is not blown, the associated input of the NAND gate 340 is connected to ground via the master fuse 330. As a result, the redundancy determining unit 210.0 cannot assert (pull low) redundancy hit signal REDHIT0# regardless of the address A<2:0> being applied to the second inputs of the exclusive-NOR gates 310.2, 310.1, and 310.0.

If the master fuse 330 is blown, the redundancy determining unit 210.0 is enabled and so is the replacement of defective normal row 2 with redundant row 0. Whenever the address of normal row 2 (i.e., 010b, which has the same pattern as the states (intact or blown) of the address fuses 320.2, 320.1, and 320.0) appears on the address bus 135, each of the exclusive-NOR gates 310.2, 310.1, and 310.0 receives the same logic level on its first and second inputs and therefore outputs a logic high to the NAND gate 340. All four inputs of the NAND gate 340 being high causes the NAND gate 340 to assert REDHIT0# indicating to the associated control logic circuit 220.0 that the normal row which associated redundant row 0 replaces (i.e., normal row 2) is being accessed.

Figure 4:
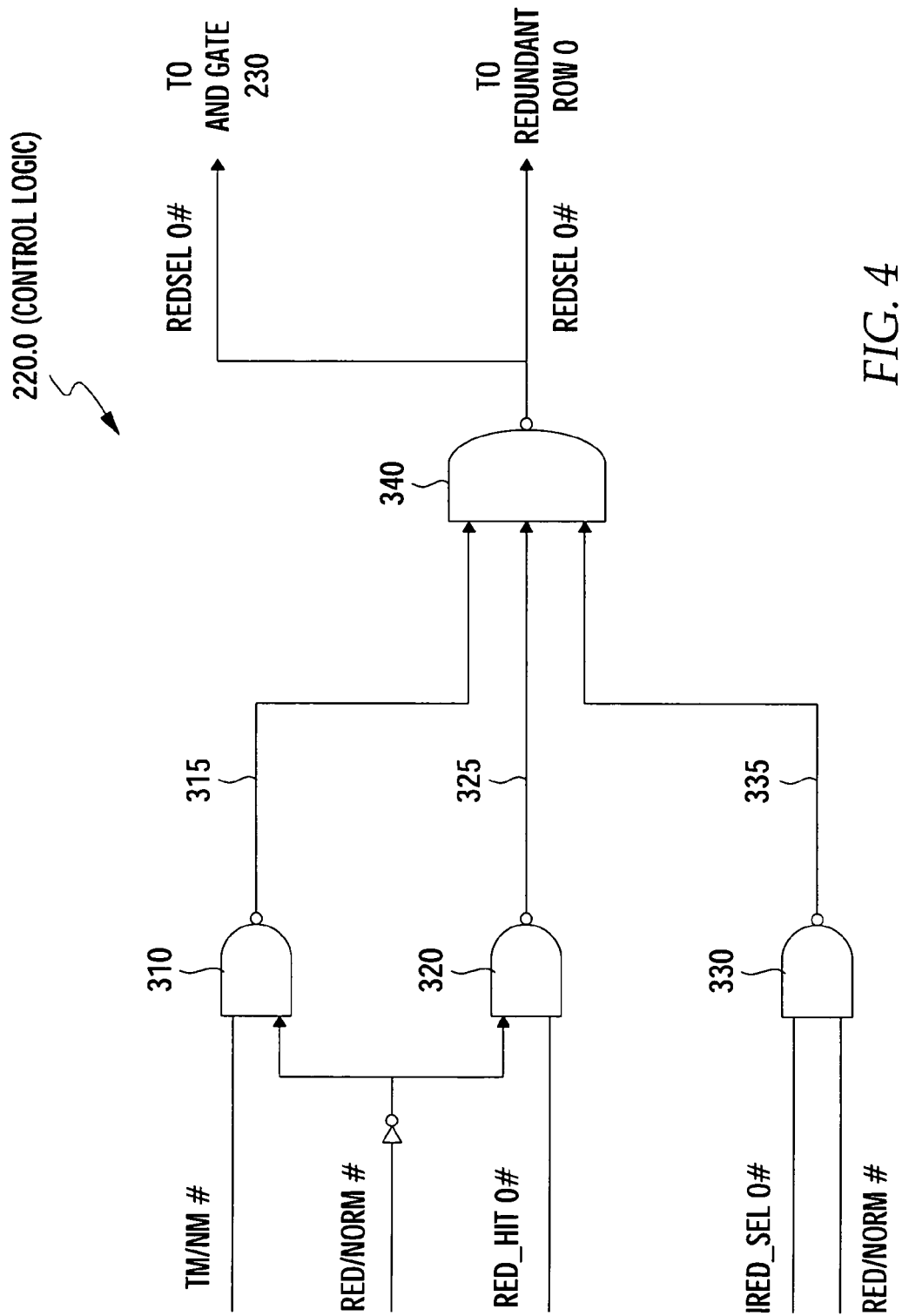
FIG. 4 is one embodiment of the control logic circuit 220.0 of FIG. 2.

FIG. 4 is one embodiment of the control logic circuit 220.0 of FIG. 2. Illustratively, the control logic circuit 220.0 comprises NAND gates 310, 320, 330, and 340. The NAND gate 310 receives TM/NM# and an inverse of RED/NORM# and generates an output signal to the NAND gate 340 via a connection 315. The NAND gate 320 receives REDHIT# from the redundancy determining unit 210.0 and an inverse of RED/NORM# and generates an output signal to the NAND gate 340 via a connection 325. The NAND gate 330 receives IREDSEL0# from redundant row decoder 270.0 and RED/NORM# and generates an output signal to the NAND gate 340 via a connection 335. The NAND gate 340 receives the output signals from the NAND gates 310, 320, and 330, and generates REDSEL0# to redundant row 0 and to the AND gate 230 (FIG. 2).

In one embodiment, if RED/NORM# is high (i.e., the tester 110 is accessing a redundant row), the state of signal REDSEL0# depends on the state of signal IREDSEL0#. More specifically, RED/NORM# being high causes both NAND gates 310 and 320 to output logic high on connections 315 and 325, respectively. As a result, the state of signal REDSEL0# address depends on the logic level on connection 335 which in turn depends on IREDSEL0#. If IREDSEL0# is low (as a result of A<2:0>=X00b), the control logic circuit 220.0 asserts REDSEL0#. If IREDSEL0# is high (as a result of A<2:0>≠X00b), the control logic circuit 220.0 deasserts REDSEL0# (pull high).

If RED/NORM# is low and TM/NM# is low (i.e., a normal row is being accessed and the memory device 120 is in normal operation mode), the state of signal REDSEL0# depends on REDHIT0#. More specifically, both RED/NORM# and TM/NM# being low causes the NAND gates 310 and 330 to pull high on connections 315 and 335, respectively. As a result, the state of signal REDSEL0# depends on the logic level on connection 325 which in turn depends on REDHIT0#. If REDHIT0# is low (a redundancy hit) indicating that the defective normal row replaced by redundant row 0 is being accessed, the control logic circuit 220.0 asserts (pulls low) REDSEL0#. If REDHIT0# is high (a redundancy miss), the control logic circuit 220.0 deasserts (pulls high) REDSEL0#.

If RED/NORM# is low and TM/NM# is high (i.e., the tester 110 is accessing a normal row and the memory device 120 is in test mode), the control logic circuit 220.0 deasserted (pulls high) REDSEL0#. More specifically, RED/NORM# being low and TM/NM# being high causes the NAND gate 310 to pull low on connection 315 which in turn causes the NAND gate 340 to deassert REDSEL0#. As a result, associated redundant row 0 is deselected. In fact, when RED/NORM# is low and TM/NM# is high, REDSELi# (i=0-3) are all deasserted. As a result, no redundant row is selected and the normal row driver 250 is enabled by deasserted NDD# so that normal rows (whether replaced or not) can be individually accessed.

Figure 5:
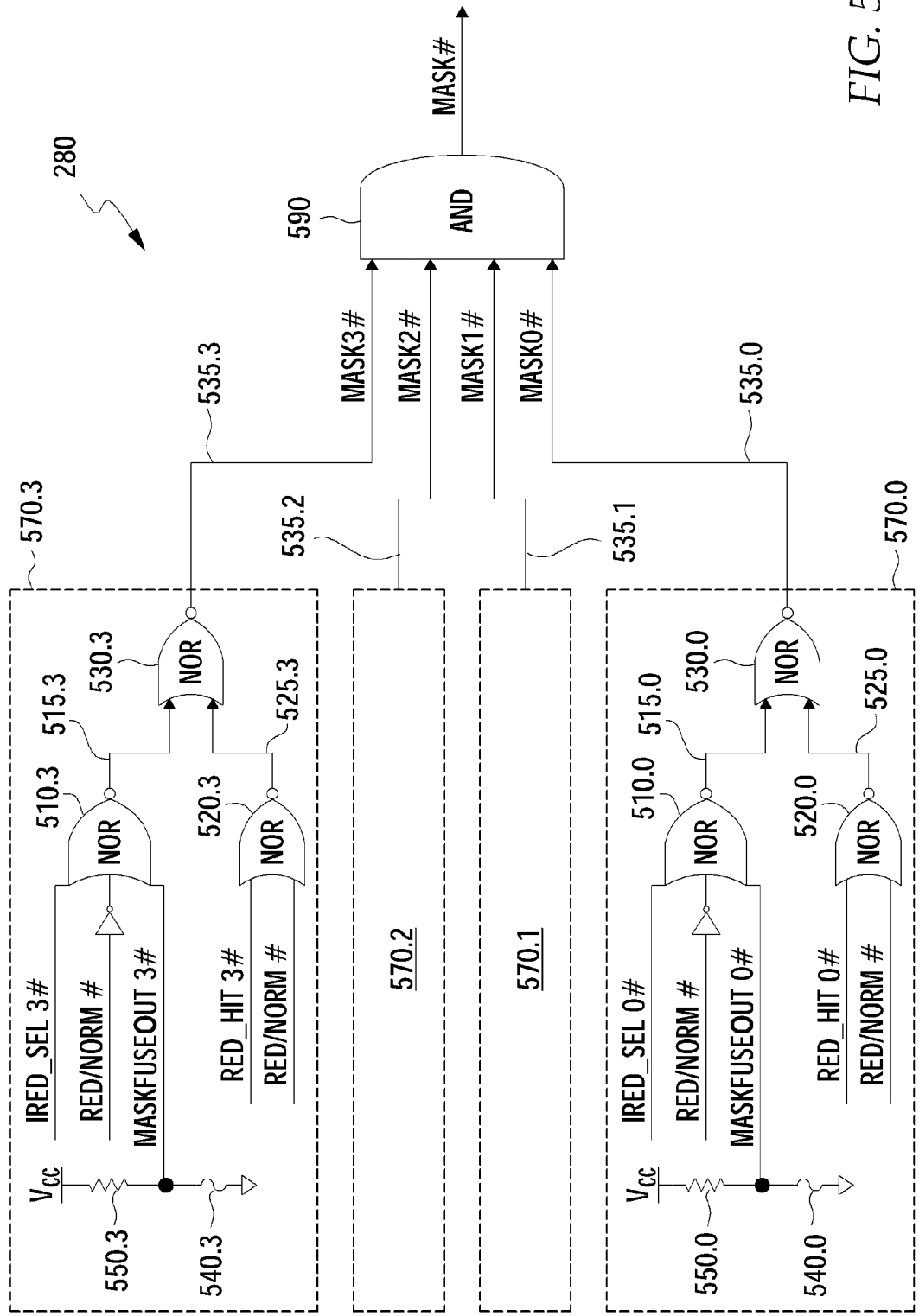
FIG. 5 is one embodiment of the mask determining circuit 280 of FIG. 2.

FIG. 5 is one embodiment of the mask determining circuit 280 of FIG. 2. Of course, the mask determining circuit 280 is just one example of a suitable mask determining circuit and the particular mask determining circuit may be determined by the particular test generating circuit 290 utilized. Illustratively, the mask determining circuit 280 comprises an AND gate 590 and four identical subcircuits 570.0, 570.1, 570.2, 570.3, associated with redundant rows 0, 1, 2, and 3, respectively, which generates mask signal MASK0#, MASK1#, MASK2#, MASK3#, respectively. For ease of description, only the two subcircuits 570.0 and 570.3 associated with redundant rows 0 and 3, respectively, are shown in details in FIG. 5 and only the subcircuit 570.0 associated with redundant row 0 is described. The other subcircuits 570.1, 570.2, 570.3 have the same functions as that of the subcircuit 570.0.

In one embodiment, the subcircuit 570.0 comprises NOR gates 510.0, 520.0, and 530.0, a mask fuse 540.0 and a resistor 550.0. A first input of the NOR gate 510.0 receives IREDSEL0# and a second input of the NOR gate 510.0 receives an inverse of RED/NORM#. A third input of the NOR gate 510.0, which receives a mask fuse signal MASKFUSEOUT0#, is coupled to Vcc via the mask fuse 540.0 and to ground via the resistor 550.0. The NOR gate 510.0 has an output connected to an input of the NOR gate 530.0 via a connection 515.0.

The NOR gate 520.0 receives REDHIT0# and RED/NORM# as inputs and has an output connected to another input of the NOR gate 530.0 via a connection 525.0. The NOR gate 530.0 receives output signals from the NOR gates 510.0 and 520.0 via connections 515.0 and 525.0, respectively, and generates MASK0# to the AND gate 590 via a connection 535.0.

During pre-replacement testing, if redundant row 0 is found defective (in contrast with the example above), the mask determining circuit 280 can be programmed to mark redundant row 0 as defective by blowing (cutting) the associated mask fuse 540.0. As a result, MASKFUSEOUT0#becomes asserted (low). Later, if the tester 110 is accessing defective redundant row 0 during post-replacement testing (i.e., whenever RED/NORM#is high and IREDSEL0#is low), all three inputs of the NOR gate 510.0 are low causing the NOR gate 510.0 to pull high on connection 515.0, which in turn causes the NOR gate 530.0 to pull low on connection 535.0. This in turn causes the AND gate 590 to assert MASK# which in turn causes the test result generating circuit 290 (FIG. 2) to pull PASS/FAIL# high on connection 175 to indicate a pass test result. As a result, the defect of redundant row 0 is not reported to the tester 110.

In one embodiment, during post-replacement testing, if the tester 110 accessing a normal row which was previously found defective during pre-replacement testing and replaced by redundant row 0, RED/NORM# is low and REDHIT0# is low. Both RED/NORM# and REDHIT0# being low causes the NOR gate 520.0 to pull high on connection 525.0, which in turn causes the NOR gate 530.0 to pull low on connection 535.0. This in turn causes the AND gate 590 to assert MASK# which in turn causes the test result generating circuit 290 (FIG. 2) to pull PASS/FAIL# high on connection 175 to indicate a pass test result. As a result, the defect of the replaced normal row is not reported to the tester 110.

In the example above, normal row 2 is found defective during pre-replacement testing and then is replaced by redundant row 0. As a result, during post-replacement testing, whenever the tester 110 is accessing defective normal row 2 (i.e., RED/NORM# is low and REDHIT0# is low), the NOR gate 520.0 pulls high on connection 525.0, which in turn causes the NOR gate 530.0 to pull low on connection 535.0. This in turn causes the AND gate 590 to assert MASK# which in turn causes the test result generating circuit 290 (FIG. 2) to pull PASS/FAIL# high on connection 175 to indicate a pass test result. As a result, the defect of replaced normal row 2 is not reported to the tester 110.

Figure 6:
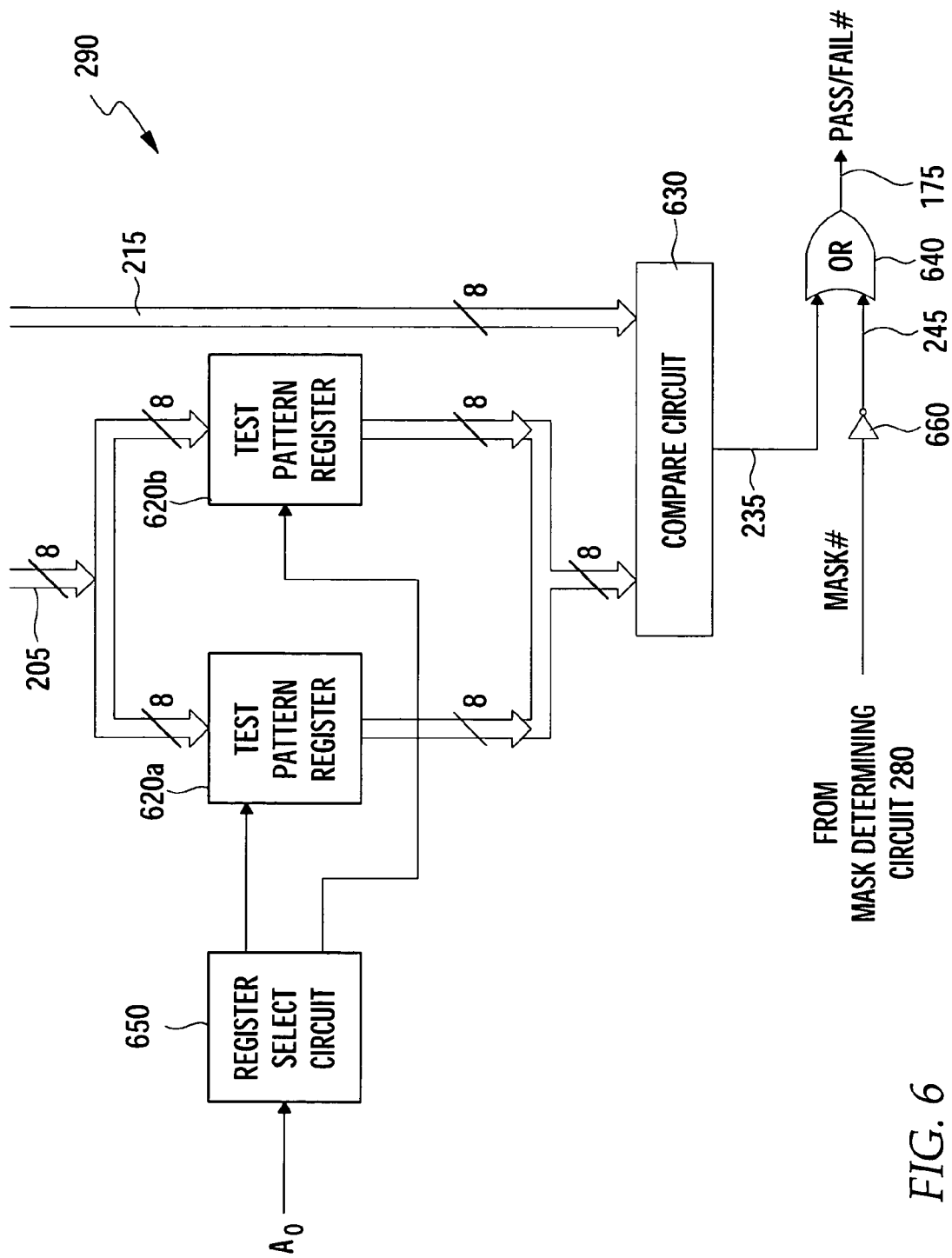
FIG. 6 is one embodiment of the test result generating circuit 290 of FIG. 2.

As previously described, any suitable test circuit may be utilized and FIG. 6 is illustrative of just one embodiment of the test result generating circuit 290 of FIG. 2. As previously described, the test result generating circuit 290 may be similar in operation to the test circuit described in the previously referenced U.S. Pat. No. 6,357,027. Illustratively, the test result generating circuit 290 comprises test pattern registers 620a and 620b, a register select circuit 650, a compare circuit 630, an inverter 660, and an OR gate 640.

Each of the registers 620a and 620b is coupled to the data bus 145 via connection 205 and is capable of receiving test patterns from the data bus 145 via connection 205. Each of the test pattern registers 620a and 620b is also coupled to the compare circuit 630 via a connection 225 and is capable of sending its contents to the compare circuit 630 via connection 225.

In one embodiment, the register select circuit 650 receives address bit A0 (or A<0>) and selects, based on the value of A0, one of the test pattern registers 620a and 620b to hold the test pattern from the data bus 145 for an accessed row. In one embodiment, the test pattern register 620a is selected to hold a first test pattern from the data bus 145 if the address of the accessed row is even (A0=0), and the test pattern register 620b is selected to hold a second test pattern (which may be the same as or different from the first test pattern) from the data bus 145 if the address of the accessed row is odd (A0=1).

The compare circuit 630 is coupled to test pattern registers 620a and 620b via the connection 225 and is capable of receiving the contents of the test pattern registers 620a and 620b. The compare circuit 630 is also coupled to the memory array 130N,130R via connection 215 and is capable of receiving the contents of an accessed row of the memory array 130N,130 via connection 215. The compare circuit 630 is capable of comparing the value it receives from one of the test pattern registers 620a and 620b via connection 225 and the value it receives from the memory array 130N,130R via connection 215. If the two values match (i.e., a match), the compare circuit 630 outputs a logic high on a connection 235 which is connected to an input of the OR gate 640. If the two values do not match (i.e., a mismatch), the compare circuit 630 outputs a logic low on connection 235.

If MASK#, which is applied to another input of the OR gate 640, is deasserted (high), the signal on connection 245 is low and therefore a match causes the OR gate 640 to pull PASS/FAIL# high on connection 175 indicating that the accessed row passes the test. A mismatch while MASK# is deasserted (i.e., high) causes the OR gate 640 pull PASS/FAIL# low on connection 175 indicating that the row fails to retain data previously written to it. If MASK# is asserted (low), the signal on connection 245 is high causing the OR gate 640 to pull PASS/FAIL# high on the connection 175 whether a match or mismatch has occurred. PASS/FAIL# being high indicates that the row whose test result is being read by tester 110 should be considered passing the test. In fact, MASK# being asserted means that the row whose test result is being read was previously found defective during pre-replacement testing. Therefore, a mismatch will occur and a fail test result will appear as a logic low on connection 235. However, this fail test result on connection 235 is masked with a pass test result (PASS/FAIL# being high) on connection 175.

In the example above, assume, during post-replacement testing, the tester 110 tests defective normal row 2 by writing a first test pattern into defective normal row 2 with RED/NORM# being low and TM/NM# being high. The first test pattern is written into normal row 2 and also into the test pattern register 620a which is selected by the register select circuit 650 (because normal row 2 is located at even address 010b). As a result, the test result generating circuit 290 memorizes the first test pattern independently from normal row 2. Assume the tester 110 later writes a second test pattern into defective redundant row 1 with RED/NORM# being high. The second test pattern is written into redundant row 1 and also into the test pattern register 620b which is selected by the register select circuit 650 (because redundant row 1 is located at odd address X01b). As a result, the test result generating circuit 290 memorizes the second test pattern independently from redundant row 1.

Later, when the tester 110 reads test results for normal row 2, the register select circuit 650 selects the test pattern register 620a to pass the first test pattern to the compare circuit 630 via connection 225. The compare circuit 630 also receives the contents of normal row 2 via connection 215. A mismatch will result from the comparison of the first test pattern from the test pattern register 620a and the contents of normal row 2 because normal row 2 is defective. However, because MASK# is asserted (due to both REDHIT0# and RED/NORM# being low resulting in MASK0# being low resulting in MASK# being low. FIG. 5), the OR gate 640 pulls PASS/FAIL# high on the connection 175 indicating that normal row 2 is considered passing the test although a mismatch occurs.

In effect, a fail test result for normal row 2 is masked with a pass test result on connection 175.

Later, when the tester 110 reads test results for redundant row 1, the register select circuit 650 selects the test pattern register 620b to pass the second test pattern to the compare circuit 630 via connection 225. The compare circuit 630 also receives the contents of redundant row 1 via connection 215. A mismatch will result from the comparison of the second test pattern from the test pattern register 620b and the contents of redundant row 1 because redundant row 1 is defective. However, because MASK# is asserted (due to IREDSEL1# being low, RED/NORM# being high, and MASKFUSEOUT1# being low, resulting in MASK1# being low resulting in MASK# being asserted. FIG. 5), the OR gate 640 pulls PASS/FAIL# high on the connection 175 indicating that redundant row 1 is considered passing the test although a mismatch occurs. In effect, a fail test result for redundant row 1 is masked with a pass test result on connection 175.

In summary, during post-replacement testing, the tester 110 can pull RED/NORM# low and TM/NM# high so that the tester 110 can access each and any normal row (by placing the address of the normal row on the address bus 135) with all replacements being disabled. If the tester 110 tests a replaced normal row by writing a test pattern into it and later reading the test result (PASS/FAIL# signal) for it on connection 175, the tester 110 will receive a passing result (PASS/FAIL# being high) because the fail test result on connection 235 is masked with a pass test result on connection 175 by asserted MASK# from the mask determining circuit 280. As a result, the defect of the replaced normal row is not reported to the tester 110.

During post-replacement testing, the tester 110 can pull RED/NORM# high so that the tester 110 can access each and any redundant row (by placing the address of the redundant row on the address bus 135). If the tester 110 tests a marked redundant row by writing a test pattern into it and later reading the test result (i.e., PASS/FAIL# signal) for it on connection 175, the tester 110 will receive a passing result (PASS/FAIL# being high) because the fail test result on connection 235 is masked with a pass test result on connection 175 by asserted MASK# from the mask determining circuit 280. As a result, the defect of the marked redundant row is not reported to the tester 110.

The embodiments described above have a plurality of advantages over conventional memory devices. First of all, the use of the mask determining circuit 280 in conjunction with the test result generating circuit 290 allows testing of the memory device 120 with the same test patterns and test programs in both pre- and post-replacement testing, without losing the programmed repair replacements. This simplifies the testing program development significantly. Moreover, it is not required to upgrade testing equipment (no bit-fail-map capability needed for post-replacement testing).

In addition, interdependencies between adjacent blocks can be checked for even after replacements. Only new defects will be reported during post-replacement testing. Known defects previously found during pre-replacement testing are masked. This significantly simplifies data gathering during a production test-flow as it decouples different test patterns and makes it possible to identify defects that are unique to one test.

Moreover, pre-replacement testing can be shortened as interdependencies between adjacent blocks can be checked for later (as late as backfield tests of packaged chips). This can reduce test costs because it is possible to sort out non-repairable chips earlier.

The mask fuses 540 (FIG. 5) make it easier to do back-end repair. Since the mask fuses 540 (FIG. 5) and the master fuses 330 (FIG. 3) are on the memory device 120, whether the redundant rows are used for replacement (i.e., master fuses 330 are blown) or the redundant rows are defective (mask fuses 540 are blown), a test program can be developed that reads the fuses 330 and 540 and determines which redundant rows are still available for further replacing defective normal rows in backend repair. It is not necessary to transfer all fuse information from the front-end test site to the back-end test site, and therefore logistics is significantly simplified.

For some embodiments, rather than identify masking bits with mask fuses, a memory device 110 may include circuitry allowing masking bits to be soft set (e.g., the masking bits may be set and reset). For example, the circuitry may allow soft-setting of masking bits by an external tester-command or internally via logic circuitry (not shown) included with to the test result generating circuit 290. In the case that only fuses are available, the wafer has to be moved from a tester to a laser-cutter in order to program the fuses. Regardless of whether masking bits are soft-settable or identified by fuses, advantages of the masking function described above is that it allows the repair (e.g., the replacement of defective arrays with redundant arrays) at different points during a test-flow and only new (incremental) failures may be detected at each point. Therefore, it is desirable to have the option to soft-set the fuses or to blow fuses directly on the tester (electrical fuses).

In the embodiments described above, details, such as the number of normal rows (8) and redundant rows (4) are for illustration only. Of course, any arbitrary number of normal rows and redundant rows is possible. Further, any type of addressing scheme may be used and a binary address space is not required (although, the type of addressing scheme should be known for test program development). Still further, the number of address fuses needed depends on a number of variables, such as the size of redundant blocks (e.g., 1 row, 2 rows, 4 rows replaced by each block) and whether each redundant row can be used to replace each normal row. Of course, while embodiments of the present invention have been described with reference to normal and redundant rows, the concepts are equally applicable to normal and redundant columns.

While the foregoing is directed to embodiments of the present invention, other and further embodiments of the invention may be devised without departing from the basic scope thereof, and the scope thereof is determined by the claims that follow.

What is claimed is:

1. A method of testing a semiconductor memory device having a plurality of normal memory elements and a plurality of redundant memory elements, comprising:
   performing a front-end test comprising:
       determining which of the normal memory elements and redundant memory elements are defective;
       replacing defective normal memory elements with non-defective redundant memory elements; and
       blowing mask fuses to indicate which of the redundant elements are defective; and
   performing a back-end test comprising, for each normal memory element:
       writing reference data to the normal memory element;
       reading stored data from the normal memory element;
       comparing the stored data read from the normal memory element to the reference data;

generating a pass result regardless of the results of the comparison if the normal memory element has been replaced by a redundant element; and generating a pass result only if the stored data matches the reference data if the normal memory device has not been replaced by a redundant element.

2. The method of claim 1, wherein the back-end test further comprises, for each redundant memory element:

writing reference data to the redundant memory element;

reading stored data from the redundant memory element;

comparing the stored data read from the redundant memory element to the reference data;

generating a pass result regardless of the results of the comparison if a mask fuse indicates the redundant memory element is defective; and generating a pass result only if the stored data matches the reference data in response to determining the memory device has not been previously found to be defective.

3. The method of claim 1, wherein the reference data and an order in which the normal memory elements are tested during the back-end test are chosen to test interdependencies between adjacent normal memory elements.

4. The method of claim 1, further comprising determining which of the redundant memory elements are non-defective based on the state of the mask fuses; and replacing normal memory elements that did not achieve a pass result with redundant memory elements determined to be non-defective.

* * * * *